United States Patent
Fisher et al.

(10) Patent No.: US 10,802,086 B2
(45) Date of Patent: Oct. 13, 2020

(54) CIRCUITS AND METHOD FOR BIASING MAGNETIC FLUX THROUGH A SUPERCONDUCTING QUANTUM INTERFERENCE ARRAY

(71) Applicant: The United States of America as represented by the Secretary of the Navy, San Diego, CA (US)

(72) Inventors: Eric C. Fisher, Poway, CA (US); Marcio C. de Andrade, San Diego, CA (US); Michael O'Brien, San Diego, CA (US)

(73) Assignee: United States of America as Represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 16/809,995

(22) Filed: Mar. 5, 2020

(65) Prior Publication Data
US 2020/0284855 A1    Sep. 10, 2020

Related U.S. Application Data

(60) Provisional application No. 62/814,628, filed on Mar. 6, 2019.

(51) Int. Cl.
G01R 33/035    (2006.01)
H03F 3/45      (2006.01)

(52) U.S. Cl.
CPC ..... *G01R 33/0358* (2013.01); *H03F 3/45475* (2013.01); *H03F 2200/129* (2013.01);
(Continued)

(58) Field of Classification Search
CPC ............. G01R 33/0358; H03F 3/45475; H03F 2200/129; H03F 2203/45116; H03F 2203/45528
See application file for complete search history.

(56) References Cited

U.S. PATENT DOCUMENTS 4,004,217 A    1/1977   Giffard
4,389,612 A    6/1983   Simmonds
(Continued)

FOREIGN PATENT DOCUMENTS

CN    104330754 B    *  9/2017
JP    2005188947 A   *  7/2005
JP    2005188947 A      7/2005

OTHER PUBLICATIONS

Finlay, C. C. et. al., "International Geomagnetic Reference Field: the eleventh generation" Geophysical Journal International, vol. 183 (2010) pp. 1216-1230, https://doi.org/10.1111/j.1365-246X.2010.04804.x.

(Continued)

*Primary Examiner* — Jay Patidar
(74) *Attorney, Agent, or Firm* — Naval Information Warfare Center, Pacific; Kyle Eppele; James McGee

(57) ABSTRACT

A circuit includes a Superconducting Quantum Interference Array (SQIF), a bias circuit, and a coil. The SQIF generates an output voltage that is a transfer function of the magnetic flux perpendicularly passing through the SQIF. An external magnetic field and a bias magnetic field supply the magnetic flux. The bias circuit generates a bias current for biasing the SQIF at an operating point. The coil generates the bias magnetic field through the SQIF from the bias current of the bias circuit. The bias magnetic field provides nullifying feedback to the SQIF that counterbalances a low-frequency portion of the external magnetic field, such that the output voltage of the SQIF detects a high-frequency portion of the external magnetic field. The circuit can be a receiver with the output voltage of the SQIF detecting an electromagnetic signal while the receiver is moving with changing orientation relative to the Earth's magnetic field.

20 Claims, 4 Drawing Sheets

(52) U.S. Cl.
CPC ............... *H03F 2203/45116* (2013.01); *H03F 2203/45528* (2013.01)

(56) References Cited

U.S. PATENT DOCUMENTS

| | | | |
|---|---|---|---|
| 5,387,864 A | 2/1995 | Gershenson | |
| 6,362,617 B1* | 3/2002 | Hubbell | G01R 33/0354 324/244 |
| 6,448,767 B1 | 9/2002 | Ganther | |
| 9,097,751 B1 | 8/2015 | Longhini | |
| 9,476,951 B2 | 10/2016 | Orozco | |
| 2011/0285393 A1* | 11/2011 | Zakosarenko | G01R 33/035 324/248 |

OTHER PUBLICATIONS

Maxwell, James Clerk, A Treatise on Electricity and Magnetism, vol. II (1873) pp. 313-327.

Mantiply, Edwin D., et al., "Summary of Measured Radiofrequency Electric and Magnetic Fields (10 kHz to 30 GHz) in the General and Work Environment" Bioelectromagnetics, vol. 18 (1997) pp. 563-577.

Mukhanov, O. et al., "Superconducting Quantum Arrays for Wideband Antennas and Low Noise Amplifiers" International Microwave Symposium (Jun. 2014).

* cited by examiner

US 10,802,086 B2

CIRCUITS AND METHOD FOR BIASING MAGNETIC FLUX THROUGH A SUPERCONDUCTING QUANTUM INTERFERENCE ARRAY

FEDERALLY-SPONSORED RESEARCH AND DEVELOPMENT

The United States Government has ownership rights in this invention. Licensing and technical inquiries may be directed to the Office of Research and Technical Applications, Naval Information Warfare Center Pacific, Code 72120, San Diego, Calif., 92152; voice (619) 553-5118; ssc_pac_t2@navy.mil. Reference Navy Case Number 110246.

BACKGROUND OF THE INVENTION

There is a general need to bias a magnetic flux through a detector, including a detector that detects one or more electromagnetic signals while the detector is moving with changing orientation relative to the Earth's magnetic field, such as a detector on a ship or aircraft.

SUMMARY

A circuit includes a Superconducting Quantum Interference Array (SQIF), a bias circuit, and a coil. The SQIF generates an output voltage that is a transfer function of the magnetic flux perpendicularly passing through the SQIF. An external magnetic field and a bias magnetic field supply the magnetic flux. The bias circuit generates a bias current for biasing the SQIF at an operating point. The coil generates the bias magnetic field through the SQIF from the bias current of the bias circuit. The bias magnetic field provides nullifying feedback to the SQIF that counterbalances a low-frequency portion of the external magnetic field, such that the output voltage of the SQIF detects a high-frequency portion of the external magnetic field.

BRIEF DESCRIPTION OF THE DRAWINGS

Throughout the several views, like elements are referenced using like references. The elements in the figures are not drawn to scale and some dimensions are exaggerated for clarity.

DETAILED DESCRIPTION OF EMBODIMENTS

The disclosed circuits and methods and below may be described generally, as well as in terms of specific examples and/or specific embodiments. For instances where references are made to detailed examples and/or embodiments, it should be appreciated that any of the underlying principles described are not to be limited to a single embodiment, but may be expanded for use with any of the other methods and systems described herein as will be understood by one of ordinary skill in the art unless otherwise stated specifically.

Figure 1:
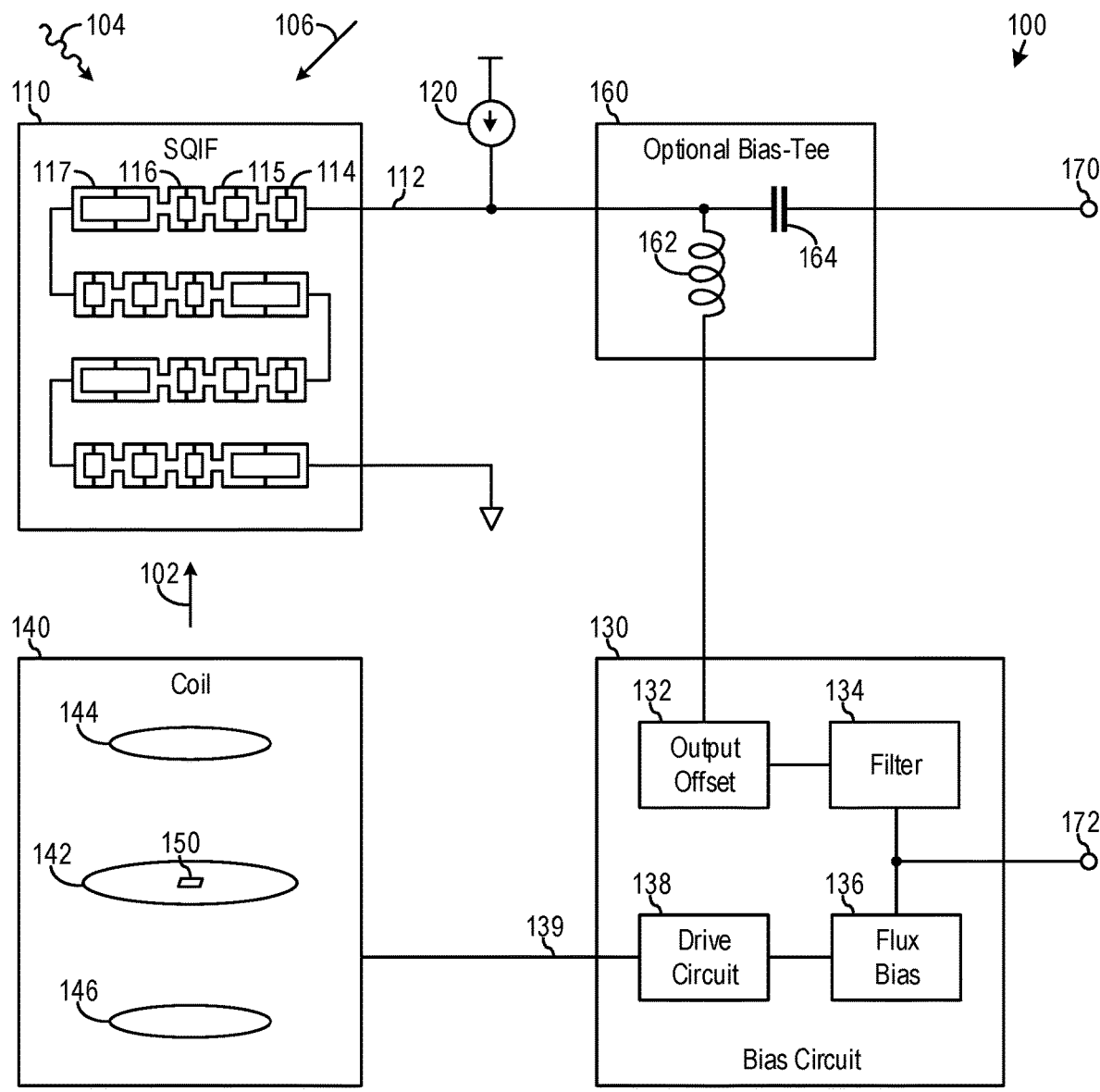
FIG. 1 is a block diagram of a circuit that biases a magnetic flux in accordance with an embodiment of the invention.

FIG. 1 is a block diagram of a circuit 100 that biases a magnetic flux of a bias magnetic field 102 in accordance with an embodiment of the invention. In an example embodiment, the circuit 100 implements a receiver for detecting an oscillating magnetic field 104 of one or more electromagnetic signals while the receiver is moving with changing orientation relative to the Earth's magnetic field 106.

The circuit 100 includes a Superconducting Quantum Interference Array (SQIF) 110. The SQIF 110 generates an output on line 112 from a transfer function 202 (see FIG. 2) of a magnetic flux through the SQIF 110. The magnetic flux through the SQIF 110 is supplied from a combination of an external magnetic field and a bias magnetic field 102. In the example embodiment, the external magnetic field is a combination of the Earth's magnetic field 106 and an oscillating magnetic field 104 of one or more electromagnetic signals, such that the magnetic flux through SQIF 110 is supplied from a combination of an oscillating magnetic field 104 of one or more electromagnetic signals, the Earth's magnetic field 106, and a bias magnetic field 102.

The circuit 100 also includes a bias circuit 130 that from the SQIF's output on line 112 generates a bias current on line 139 for biasing the SQIF 110 at an operating point via coil 140.

The coil 140 generates the bias magnetic field 102 from the bias current on line 139. As explained further below, the bias magnetic field 102 provides nullifying feedback to the SQIF 110 that counterbalances a low-frequency portion of the external magnetic field, such that the output 112 of the SQIF 110 detects a high-frequency portion of the external magnetic field. In the example embodiment, the movement that changes the orientation of circuit 100 relative to the Earth's magnetic field 106 induces some or all of a low-frequency portion of the external magnetic field, such that the bias magnetic field 102 provides nullifying feedback to the SQIF 110 that counterbalances at least the changing orientation between circuit 100 and the Earth's magnetic field 106, and therefore the SQIF's output on line 112 detects the high-frequency portion of the oscillating magnetic field 104 of one or more electromagnetic signals, such as concurrently detecting multiple radio-frequency electromagnetic signals with frequencies up to 100 GHz.

Figure 2:
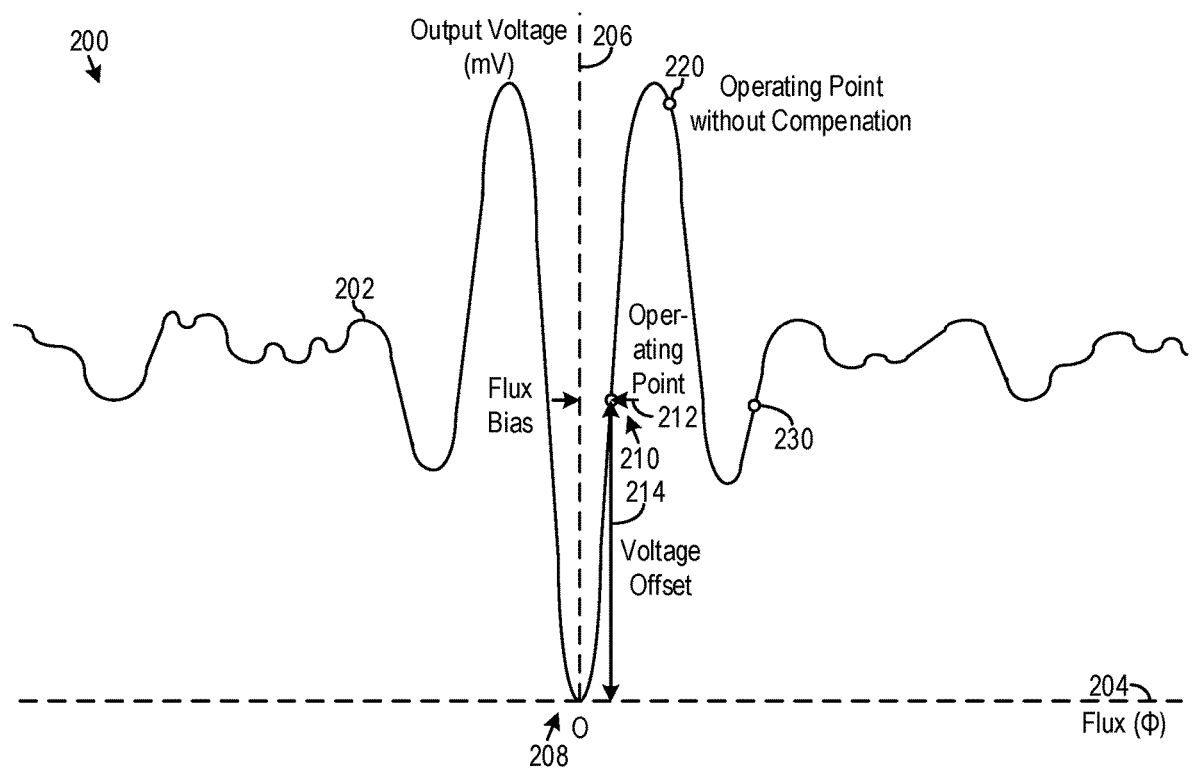
FIG. 2 is a graph of a transfer function between a magnetic flux through the SQIF and an output voltage of the SQIF in accordance with an embodiment of the invention.

FIG. 2 is a graph 200 of a transfer function 202 between a magnetic flux through the SQIF along a horizontal axis 204 and an output voltage from the SQIF along a vertical axis 206 in accordance with an embodiment of the invention. The graph's origin 208 at the intersection between axes 204 and 206 is where the magnetic flux through the SQIF has a value of zero flux and the output voltage is zero millivolts. Because the transfer function 202 passes through origin 208, when no net magnetic flux passes through the SQIF, the output voltage from the SQIF is zero millivolts.

As the magnetic flux increases from zero at origin 208, the output voltage from transfer function 202 increases slowly at first, and then enters an extended region of steep slope where the output changes considerably when the magnetic flux changes slightly, especially as compared any other monotonic region of the transfer function 202. This region is centered on the ideal operating point 210 having a magnetic flux bias 212 and a voltage offset 214. When the SQIF is operating at operating point 210, the transfer function 202 shows that the SQIF detects and amplifies small changes in the magnetic flux passing through the SQIF into considerable changes in the output voltage from the SQIF. This detection and amplification of transfer function 202 is approximately linear across a range of the magnetic flux centered on the flux bias 212 of the operating point 210, with the linear range extending from nearly zero flux to nearly twice the flux bias 212. Within this linear range, the output voltage changes considerably from the voltage offset 214 of the operating point 210 in response to the magnetic flux changing slightly from the flux bias 212 of the operating point 210, with the linear range extending from an output voltage of nearly zero millivolts to nearly twice the voltage offset 214.

Returning to FIG. 1, the transfer function 202 of FIG. 2 is provided from the SQIF 110 that is a planar array of Superconducting Quantum Interference Devices (SQUID) including SQUIDs 114, 115, 116, and 117. In the example embodiment, the SQUIDs are bi-SQUIDs each including a loop of superconducting material broken by three Josephson junctions. The SQUIDs in the planar array are connected in series for conducting a shared current from current source 120. The SQUIDs in the planar array are spatially arranged with respective sizes distributed to provide the transfer function 202 for a particular value of the shared current from current source 120. To provide the transfer function 202 providing a range of high amplification of the magnetic flux through the SQIF, the number of SQUIDs in the SQIF is hundreds or thousands of SQUIDs, with more SQUIDs in the SQIF generally providing higher amplification because the output voltage on line 112 accumulates the voltage across each individual SQUID in the planar array.

Referring briefly back to FIG. 2, if the magnetic flux through the SQIF gets too high, such as more than twice the flux bias 212, the transfer function 202 exits the linear range with high amplification. There are several possible causes for the magnetic flux through the SQIF getting too high. An electromagnetic signal strongly driven from a nearby antenna can produce an oscillating magnetic field 104 having a range of magnetic flux spanning more than twice the flux bias 212. Then, even if the DC operating point is operating point 210, the oscillating magnetic field 104 of an electromagnetic signal produces an amplified output voltage with distortion that truncates the peaks of the oscillating magnetic field 104, and this non-linearity generally inhibits concurrently detecting other weaker electromagnetic signals of different frequencies. Another possible cause for the magnetic flux getting too high is an external magnetic field, such as the Earth's magnetic field 106, providing a nominally constant flux that moves the operating point from the desired operating point 210 to a new operating point 220, which produces little or no amplification of oscillating magnetic field 104.

When the circuit 100 and its SQIF 110 operates in motion, such as on a ship or an aircraft, the orientation of the circuit 100 with respect to the Earth's magnetic field 106 varies with time. Because the SQIF 110 responds to the component of the combined magnetic field passing perpendicularly through a plane of the SQIF 110, the strength of the perpendicular component of the magnetic field as measured by SQIF 110 changes with the changing spatial orientation between SQIF 110 and the Earth's magnetic field 106. These changes in relative orientation between SQIF 110 and the Earth's magnetic field 106 are sufficiently large to move operating point from the desired operating point 210 to a non-amplifying operating point 220.

Furthermore, the strength of the Earth's magnetic field 106 ranges from about 25 µT to 65 µT across the Earth's surface. This entire range cannot fit within the available linear range of the SQIF 110 of the example embodiment providing high amplification. Thus, variations in the strength and direction of the Earth's magnetic field 106 with geographical location are also sufficiently large to move the operating point from the desired operating point 210 to a non-amplifying operating point 220.

The range of compensation needed is as much as the 130 µT change occurring when an aircraft carrying SQIF 110 reverses direction from parallel to anti-parallel to the Earth's magnetic field 106 at a geographical location where the Earth's magnetic field 106 is maximal at 65 µT.

Significant changes in the Earth's magnetic field 106 (e.g. on the order of 1 µT) due solely to changes in geographical location require hours of vehicle movement. Minutes are required for significant changes in orientation between a large ship and the Earth's magnetic field 106. About one second is required for significant changes in orientation between a small aircraft and the Earth's magnetic field 106 during a banking maneuver, and less than a second is required for significant changes in orientation between a small aircraft and the Earth's magnetic field 106 during a roll maneuver. Thus, the cut-off frequency is selected as 200 Hz in the example embodiment to compensate for changes in the Earth's magnetic field 106 within an order of magnitude of the expected changes.

The bias circuit 130 actively compensates for the low-frequency components of the magnetic field through the SQIF 110. This allows for motion of the circuit 100 and its SQIF 110 relative to the Earth's magnetic field 106 while retaining the desired operating point 210 specified by the spatial arrangement and distributed sizes of the SQUIDs in the SQIF 110. The bias circuit 130 processes the output voltage on line 112 from SQIF 110 to determine the magnetic flux of the bias magnetic field 102 that is needed to keep SQIF 110 at the ideal operating point 210.

In one embodiment, bias circuit 130 feeds a time integral of the output voltage on line 112 back into the SQIF 110 as the bias magnetic field 102. With a proper amount a gain, the negative feedback cancels the low-frequency components of a combined magnetic field passing through SQIF 110, thereby canceling the contribution from the Earth's magnetic field 106. The circuit 100 is very stable; the phase margin for the open loop transfer function, which is an integrator with gain, is $\pi/2$. The bias circuit 130 only processes low frequencies, and the magnitude of the feedback gain tunes the upper limit on these processed low frequencies.

Assuming a feedback delay of zero, the total closed-loop transfer function from a strength of the magnetic field through SQIF 110 to the output voltage on line 112 is:

$$H(s)=s/[(A/\tau)+s]$$

where s is the complex Laplace transform variable, A is a real number that represents the product of various feedback gains in the system, and $\tau$ is a time constant for the integrator. For an RC integrator, $\tau=RC$.

Thus, the feedback makes circuit 100 act as a first-order high-pass filter with a half-power frequency of $A/\tau$. If the frequency of the incoming magnetic flux through the SQIF 110 is much larger than $A/\tau$, the incoming flux is directly determined from the output voltage on line 112. If the frequency of the incoming magnetic flux is much less than $A/\tau$, then the incoming flux is attenuated drastically from the output voltage on line 112. In summary, the negative feedback attenuates the low-frequency components of the magnetic flux of the magnetic field perpendicularly passing through a plane of the SQIF 110, with the magnetic field being a combination of an oscillating magnetic field 104 of one or more electromagnetic signals, the Earth's magnetic field 106, and the bias magnetic field 102 carrying the nullifying feedback.

The example embodiment specifies the cut-off frequency of 200 Hz should be attenuated by a factor 130, such that the system gain A/τ=26 kHz. This places the half-power frequency of the circuit 100 at 26 kHz.

The circuit 100 is highly stable; however, the circuit 100 can oscillate with sufficient delay, α, around the feedback loop. Beginning with the first order Padé approximation α=2τ/A, and then iterating numerically, the maximum allowable delay is $\alpha_{max}$=60 μs. The actual maximum delay should be an order of magnitude less than this, or less than 6 μs for good performance.

Referring again to FIG. 1 and FIG. 2, bias circuit 130 includes a voltage-offset circuit 132 generating a difference between the SQIF's output voltage on line 112 and the voltage offset 214, which the SQIF 110 generates when operating at the ideal operating point 210. The bias circuit 130 includes a filter 134 for separating a low-frequency component of the difference generated by a voltage-offset circuit 132. The bias circuit 130 includes a flux-bias circuit 136 generating a sum of the low-frequency component and a flux-bias voltage that corresponds to the flux bias 212, which the SQIF 110 needs to receive when operating at the ideal operating point 210. The bias circuit 130 includes a drive circuit 138 generating the bias current on line 139 for driving the coil 140. To generate bias current on line 139, the drive circuit 138 multiplies the sum from flux-bias circuit 136 by a proportionality factor.

The flux-bias voltage of flux-bias circuit 136 corresponds to flux bias 212 of the ideal operating point 210 because, in an absence of any perturbation from the oscillating magnetic field 104 and the Earth's magnetic field 106, the drive circuit 138 generates from this flux-bias voltage a bias current on line 139 that causes coil 140 to supply a bias magnetic field 102 having a strength threaded through the SQIF 110 equaling the flux bias 212.

In one particular embodiment, the coil 140 has a Maxwell configuration. The coil 140 generates the bias magnetic field 102 through the SQIF 110 from the bias current on line 139 from the bias circuit 130. The Maxwell configuration of coil 140 includes a first coil 142, a second coil 144, and third coil 146 connected in series for conducting the bias current on line 139. Reference 150 indicates a position of the SQIF 110 inside coil 140, and the coil 140 generates the bias magnetic field 102 that is substantially uniform across the SQIF 110 positioned at reference 150, such as a discrepancy from uniformity of less than 0.1%.

The first coil 142 has a radius of 5 cm in a plane of the SQIF 110 at reference 150. The second coil 144 has a radius of 3.78 cm at 3.27 cm above the plane of the SQIF 110 at reference 150. The third coil 146 symmetrically has a radius of 3.78 cm at 3.27 cm below the plane of the SQIF 110 at reference 150. A ratio of a number of windings of the second coil 144 to the first coil 142 is 53 to 64, and similarly for a ratio of a number of windings of the third coil 146 to the first coil 142. This coil 140 of a Maxwell configuration generates a magnetic field that is substantially uniform, with simulations showing a discrepancy of at most 0.03% across a 0.8 cm by 0.8 cm active area of the SQIF 110 at reference 150. With 53 windings in the second coil 144 and the third coil 146, and with 64 windings in the first coil 142, a bias current on line 139 of 4 milliamperes produces a substantially uniform magnetic field of 130 μT.

In this particular embodiment, the coils 142, 144, and 146 and the SQIF 110 at reference 150 are all disposed outside a cryostat providing the cryogenic temperatures required for superconductivity of the SQUIDs of the SQIF 110. It will be appreciated that the coils 142, 144, and 146 can be disposed inside the cryostat containing the SQIF 110 at reference 150.

In another particular embodiment, the coil 140 has a Helmholtz configuration. The Helmholtz configuration is similar to the Maxwell configuration, but the first coil 142 is omitted and the second and third coils 144 and 146 are disposed closer together. The second and third coils 144 and 146 are connected in series for conducting the bias current on line 139. The second and third coils 144 and 146 each have a radius of 2 cm, with the second coil 144 extending from 0.93 to 1 cm above a plane of the SQIF 110 at reference 150 and the third coil 146 extending from 0.93 to 1 cm below the plane of the SQIF 110 at reference 150. This coil 140 of a Helmholtz configuration generates a magnetic field that is substantially uniform, with simulations showing a discrepancy of at most 0.07% across a 0.8 cm by 0.8 cm active area of the SQIF 110.

In FIG. 1, the optional bias-tee 160 separates the lower and higher frequency components of the SQIF's voltage output on line 112. An advantage of including the bias-tee 160 is that the bias circuit 130 might have input capacitance and noise feedback that adversely affects the high-frequency component, and the inductor 162 of bias-tee 160 isolates the high-frequency component from the bias circuit 130 so that all of the high-frequency component from the SQIF's voltage output on line 112 is output via capacitor 164 of bias-tee 160 to the high-frequency output on line 170 of circuit 110. Note, however, that inductor 162 has its own parasitic input capacitance in practice.

Circuit 100 not only provides the high-frequency output on line 170, but also provides the low-frequency output on line 172 from bias circuit 130. No frequencies of the external magnetic field passing through SQIF 110 are lost nominally, but for an external magnetic field having a frequency component at the half-power frequency of the circuit 100 (26 kHz in the example embodiment), half of this frequency component appears at the high-frequency output on line 170 and the other half appears on the low-frequency output on line 172. Thus, together the high-frequency output on line 170 and the low-frequency output on line 172 permit detection of electromagnetic signals with frequencies between 0 and 100 GHz. To preserve all frequencies when bias-tee 160 is included, bias-tee 160 should have a half-power frequency approximately matching the half-power frequency of bias circuit 130. In the example embodiment, the bias-tee 160 has a cut-off frequency of about 12 kHz approximately matching the half-power frequency of 26 kHz of circuit 100.

If the low-frequency output on line 172 is caused solely by the Earth's magnetic field 106 including changing orientation between the SQIF 110 and the Earth's magnetic field 106, then the low-frequency output on line 172 indicates the changing orientation between the SQIF 110 and the Earth's magnetic field 106, especially after accounting for the strength of the Earth's magnetic field 106 at the current geographical location. This, together with a value of the bias magnetic field, gives an angle between the normal to a plane of the SQIF 110 and the local direction of the Earth's magnetic field 106.

Figure 3:
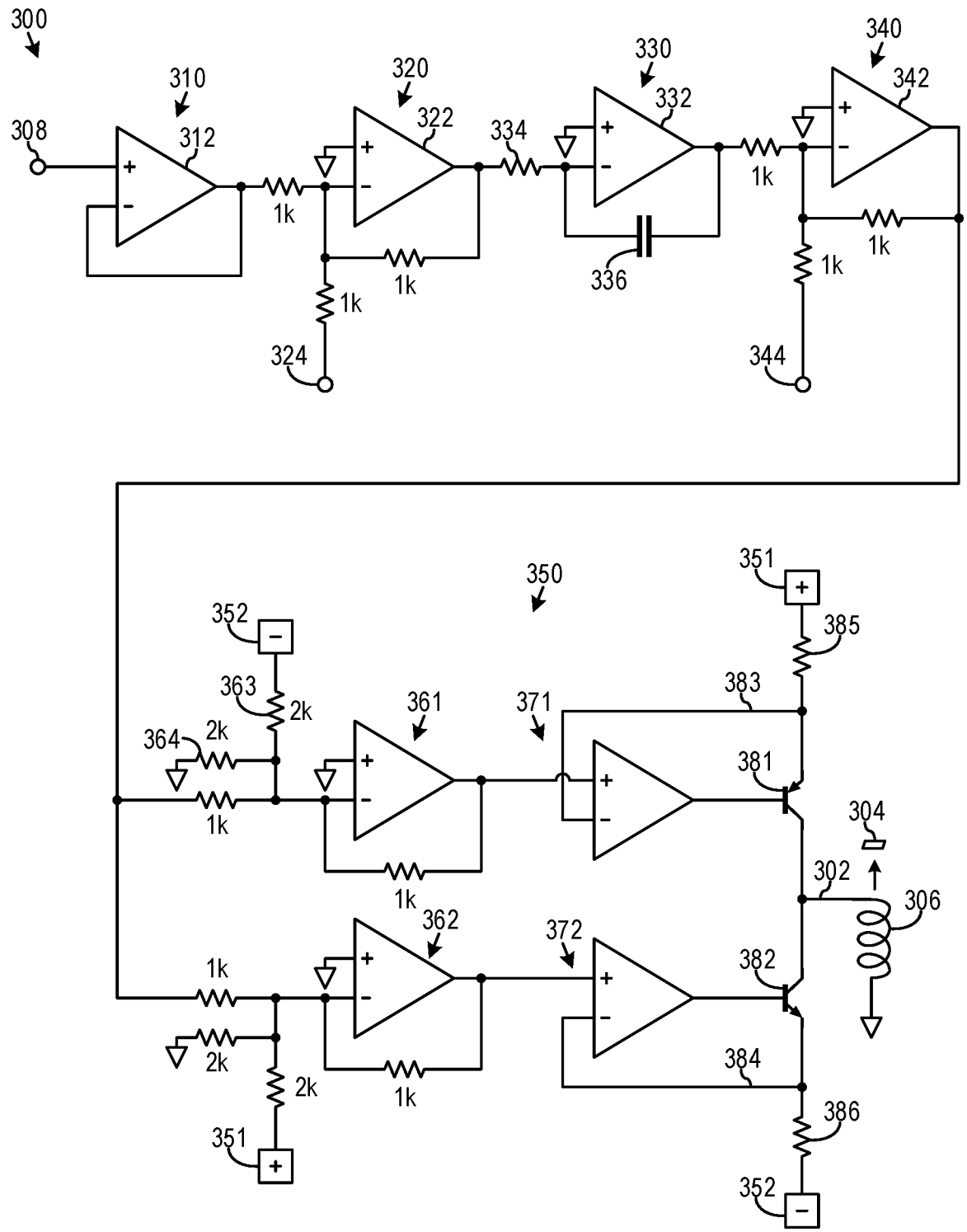
FIG. 3 is a block diagram of a circuit for generating a bias current for biasing a SQIF at an operating point in accordance with an embodiment of the invention.

FIG. 3 is a block diagram of a bias circuit 300 for generating a bias current on line 302 for biasing a SQIF disposed at reference 304 at an operating point in accordance with an embodiment of the invention. The bias current on line 302 conducted through coil 306 causes coil 306 to generate a bias magnetic field through the SQIF disposed at reference 304. The bias circuit 300 generates the bias current on line 302 from the SQIF's output voltage 308.

A first stage 310 of circuit 300 is operational amplifier 312 arranged as a buffer that buffers the SQIF's output voltage 308. This buffer has a high input impedance that prevents the 1 k Ohm input impedance of the second stage 320 from loading the DC current source 120 that provides the shared current to the SQUIDs of SQIF 110 (FIG. 1).

The second stage 320 includes operational amplifier 322 arranged to generate a differential voltage that subtracts the voltage offset 324, which is selected to equal the voltage offset of the ideal operating point, from the buffering of the SQIF's output voltage 308. Using different values of the input and feedback resistors in second stage 320 can tune the gain of the second stage 320 and thereby tune the overall feedback gain of the system. When the external magnetic field is oscillating, the differential voltage from operational amplifier 322 oscillates about an average value of zero when operating at the ideal operating point, but the differential voltage from operational amplifier 322 has a non-zero average value when operating away from the ideal operating point.

The third stage 330 includes operational amplifier 332 arranged with a resistor 334 and a capacitor 336 to implement an inverting integrator that separates the low-frequency component of the differential voltage from the second stage 320. The resistor 334 and capacitor 336 specify the time constant τ=RC of the integrator and define the cut-off frequency 1/RC of the integrator. The capacitor 336 should be a non-polarized capacitor. The integrator passes the low frequency component including frequencies below the cut-off frequency. When operating at the ideal operating point, the filtered voltage from operational amplifier 332 is a static voltage of nominally zero millivolts. When operating away from the ideal operating point, the filtered voltage from operational amplifier 332 is a static voltage or a low-frequency varying voltage that specifies the degree of departure from the ideal operating point.

The fourth stage 340 includes operational amplifier 342 arranged to generate a summation voltage that adds the flux-bias voltage 344 to the filtered voltage from the third stage 330. The flux-bias voltage 344 is selected so that when there is no external magnetic field, the coil 306 ultimately generates the magnetic flux bias of the operating point.

The fifth stage 350 is a drive circuit that is a voltage-controlled current source including a pair of level-shifters 361 and 362, a pair of voltage followers 371 and 372, and a pull-up transistor 381 and a pull-down transistor 382. The transistors 381 and 382 are both coupled to a terminal of the coil 306.

The level-shifter 361 positively shifts the summation voltage from the fourth stage 340. The negative power supply 352 and resistors 363 and 364 form a Thevenin equivalent, which is a voltage source of half the negative power supply 352 in series with a 1 k Ohm resistor, making all resistance values equal at level-shifter 361. Thus, because the positive power supply 351 and the negative power supply 352 have equal magnitudes, the level-shifter 361 adds half the positive power supply 351 to the summation voltage from the fourth stage 340. Similarly, level-shifter 362 negatively shifts the summation voltage from the fourth stage 340 by subtracting half the negative power supply 352 from the summation voltage from the fourth stage 340.

The voltage follower 371 drives pull-up transistor 381 to make the followed voltage on line 383 equal to the positively shifted voltage from level-shifter 361. Similarly, voltage follower 372 drives pull-down transistor 382 to make the followed voltage on line 384 equal to the negatively shifted voltage from level-shifter 362. Thus, the current through pull-up resistor 385 is proportional to half of a power supply minus the summation voltage from the fourth stage 340, and the current through pull-down resistor 386 is proportional to half of a power supply plus the summation voltage from the fourth stage 340. The difference between these pull-up and pull-down currents is the bias current through coil 306, such that the bias current on line 302 is proportional to twice the summation voltage from the fourth stage 340. Therefore, the voltage-controlled current source of the entire fifth stage 350 multiples the summation voltage from the fourth stage 340 by a proportionality factor.

Thus, while operating at the operating point, the coil 306 supplies the magnetic flux bias of the operating point because the bias current on line 302 measured in milliamperes equals the flux-bias voltage 344 measured in millivolts multiplied by this proportionality factor measured in milliamperes per millivolts.

In a specific implementation of bias circuit 300, the operational amplifiers 312, 322, 332, 342, and the operational amplifiers within level-shifters 361 and 362 and voltage followers 371 and 372 are LF411 operational amplifiers from Texas Instruments. Testing of this specific implementation of the bias circuit 300 connected to an inductor, which models coil 306, showed that in isolation the specific implementation of bias circuit 300 performed as expected.

Figure 4:
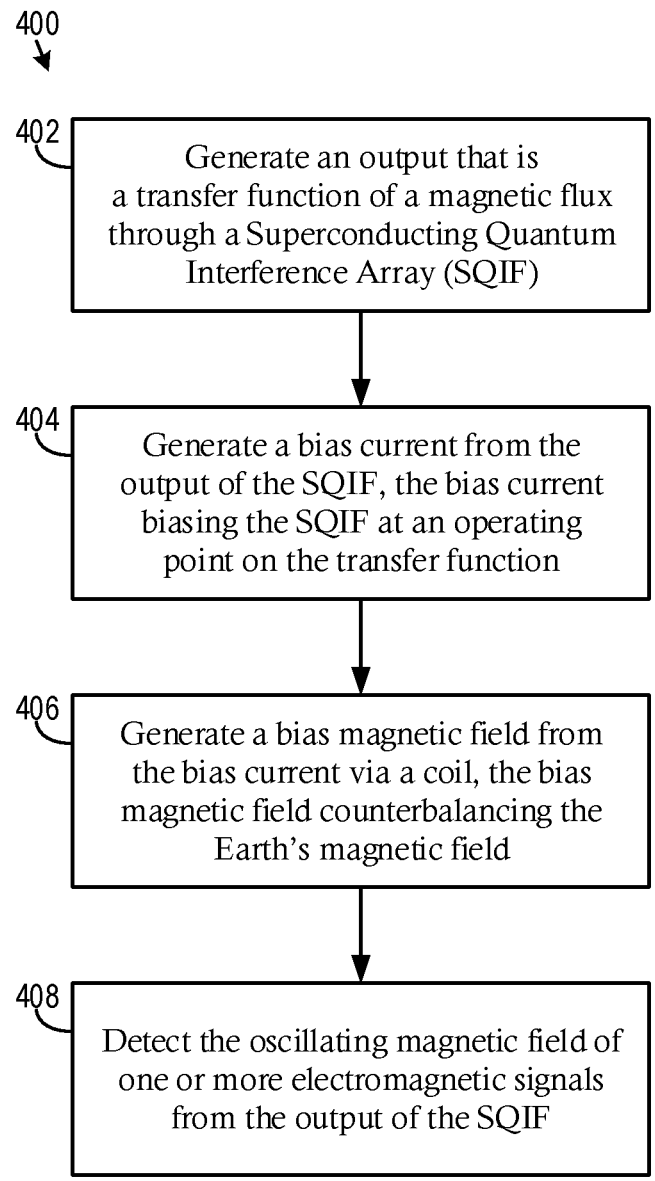
FIG. 4 is a flow diagram of a process for detecting one or more electromagnetic signals in accordance with an embodiment of the invention.

FIG. 4 is a flow diagram of a process 400 for detecting one or more electromagnetic signals in accordance with an embodiment of the invention. For example, the electromagnetic signal is a radio-frequency electromagnetic signal of up to 100 GHz.

At step 402, an output is generated that is a transfer function of a magnetic flux through a Superconducting Quantum Interference Array (SQIF). The magnetic flux is supplied from a combination of an oscillating magnetic field of one or more electromagnetic signals, the Earth's magnetic field, and a bias magnetic field.

At step 404, a bias current is generated from the output of the SQIF. The bias current biases the SQIF at an operating point having a first value of the magnetic flux through the SQIF and a second value of the output of the SQIF. The transfer function provides the second value of the output of the SQIF when the magnetic flux through the SQIF equals the first value.

At step 406, the bias magnetic field is generated from the bias current via a coil. The bias magnetic field provides nullifying feedback to the SQIF that counterbalances the Earth's magnetic field.

At step 408, the oscillating magnetic field of the at least one electromagnetic signal is detected from the output of the SQIF.

From the above description of the circuit 100 and circuit 400, it is manifest that various techniques may be used for implementing the concepts of circuit 100 and process 400 without departing from the scope of the claims. The described embodiments are to be considered in all respects as illustrative and not restrictive. The circuit/process disclosed herein may be practiced in the absence of any element that is not specifically claimed and/or disclosed herein. It should also be understood that circuit 100 and process 400 is not limited to the particular embodiments described herein, but is capable of many embodiments without departing from the scope of the claims.

For example, the circuit 100 normally operates far enough away from strongly driven antennas so that the linear operating range of the SQIF 110 is not exceeded due to electromagnetic radiation from the strongly driven antennas. However, the circuit 100 can include a peak detector tied to the output of the second stage 320 of bias circuit 300 for detecting an electromagnetic signal so strong as to exceed the linear operating range of the SQIF 110. In response, a new operating point is selected having lower amplification, such as secondary operating point 230 of FIG. 2.

In another example, a proportional-integral-derivative (PID) controller can substitute for the simple integrator of third stage 330 of bias circuit 300. Although a PID controller requires more complicated circuitry, a PID controller provides a sharper cut-off between separating the low-frequency components and the high-frequency components, and a flatter frequency response within the low-frequency components and the high-frequency components.

We claim:

1. A receiver for detecting at least one electromagnetic signal while the receiver is moving with changing orientation relative to the Earth's magnetic field, the receiver comprising:
   a Superconducting Quantum Interference Array (SQIF) for generating an output that is a transfer function of a magnetic flux through the SQIF, wherein the magnetic flux is supplied from a combination of an oscillating magnetic field of the at least one electromagnetic signal, the Earth's magnetic field, and a bias magnetic field;
   a bias circuit for generating, from the output of the SQIF, a bias current for biasing the SQIF at an operating point having a first value of the magnetic flux through the SQIF and a second value of the output of the SQIF, the bias circuit including an offset circuit for generating a difference between the output of the SQIF and the second value, wherein the transfer function provides the second value of the output of the SQIF when the magnetic flux through the SQIF equals the first value; and
   a coil for generating the bias magnetic field through the SQIF from the bias current of the bias circuit, wherein the bias magnetic field provides nullifying feedback to the SQIF that counterbalances the Earth's magnetic field including the changing orientation between the receiver and the Earth's magnetic field, such that the output of the SQIF detects the oscillating magnetic field of the at least one electromagnetic signal.

2. The receiver of claim 1, wherein the SQIF is a planar array of Superconducting Quantum Interference Devices (SQUID), the SQUIDs in the planar array connected in series for conducting a shared current and spatially arranged with respective sizes distributed to provide the transfer function that at the first value of the magnetic flux through the SQUIDs is approximately linear across a range of the magnetic flux centered around the first value, with the output changing considerably from the second value in response to the magnetic flux changing slightly from the first value.

3. The receiver of claim 2, wherein the output of the SQIF is the transfer function of the magnetic flux that passes perpendicularly through the planar array.

4. The receiver of claim 1, wherein the bias circuit further includes:
   a filter for separating a low-frequency component of the difference, from the offset circuit, between the output of the SQIF and the second value; and
   a drive circuit for generating the bias current that multiplies a sum of the low-frequency component and a third value by a proportionality factor, wherein the coil supplies the first value of the magnetic flux of the operating point when the bias current though the coil equals the third value multiplied by the proportionality factor.

5. The receiver of claim 1, wherein the bias circuit includes:
   the offset circuit that is a voltage-offset circuit for generating the difference between the output of the SQIF and the second value;
   a filter for separating a low-frequency component of the difference;
   a flux-bias circuit for generating a sum of the low-frequency component and a third value, wherein the coil generates the bias magnetic field that, in an absence of perturbation from the oscillating magnetic field and the Earth's magnetic field, supplies the first value of the magnetic flux of the operating point when the bias current though the coil equals the third value multiplied by a proportionality factor; and
   a drive circuit for generating the bias current that multiplies the sum by the proportionality factor.

6. The receiver of claim 5, wherein the filter is an integrator having a cut-off frequency, and the integrator passes the low-frequency component including a plurality of frequencies below the cut-off frequency, wherein the bias circuit provides the nullifying feedback of the low-frequency component via the coil, the nullifying feedback making the output of the SQIF provide a high-frequency component including a plurality of frequencies above the cut-off frequency.

7. The receiver of claim 6, wherein the high-frequency component from the output of the SQIF detects the oscillating magnetic field of the at least one electromagnetic signal that is a plurality of radio-frequency electromagnetic signals.

8. The receiver of claim 5, wherein the drive circuit is a controlled current source including a pair of level-shifters respectively shifting the sum positively and negatively and respectively driving a pull-up transistor and a pull-down transistor both coupled to a terminal of the coil.

9. The receiver of claim 5, wherein:
   the output of the SQIF is an output voltage measured in millivolts, wherein the second value is the output voltage at the operating point,
   the difference is a differential voltage generated from subtracting the second value from the output voltage,
   the low-frequency component is a filtered voltage generated from the differential voltage,
   the sum is a summation voltage generated from adding the filtered voltage and the third value, which is a flux-bias voltage, wherein the coil supplies the first value of the magnetic flux at the operating point when the bias current though the coil equals the flux-bias voltage multiplied by the proportionality factor, and
   the bias current measured in milliamperes is the summation voltage multiplied by the proportionality factor measured in milliamperes per millivolts.

10. The receiver of claim 5, wherein the low-frequency component indicates the changing orientation between the receiver and the Earth's magnetic field.

11. The receiver of claim 1, wherein the coil generates the bias magnetic field that is substantially uniform across the SQIF.

12. The receiver of claim 11, wherein the coil has a Maxwell configuration including a first, second, and third coil connected in series for conducting the bias current, the first coil having a radius of 5 cm in a plane of the SQIF, the second coil having a radius of 3.78 cm at 3.27 cm above the plane of the SQIF, and the third coil having a radius of 3.78 cm at 3.27 cm below the plane of the SQIF, wherein a ratio of a number of windings of the second to first coils and also the third to first coils is 53 to 64.

13. The receiver of claim 11, wherein the coil has a Helmholtz configuration including a first and second coil connected in series for conducting the bias current, the first and second coils each having a radius of 2 cm with the first coil extending from 0.93 to 1 cm above a plane of the SQIF and the second coil extending from 0.93 to 1 cm below the plane of the SQIF.

14. A circuit having biasing of a magnetic flux comprising:
   a Superconducting Quantum Interference Array (SQIF) for generating an output voltage that is a transfer function of the magnetic flux perpendicularly passing through the SQIF, wherein an external magnetic field and a bias magnetic field supply the magnetic flux;
   a bias circuit for generating, from the output voltage of the SQIF, a bias current for biasing the SQIF at an operating point having a first value of the magnetic flux perpendicularly passing through the SQIF and a second value of the output voltage of the SQIF, the bias circuit including a voltage-offset circuit for generating a differential voltage that is a difference between the output voltage of the SQIF and the second value of the output voltage of the SQIF, wherein the transfer function provides the second value of the output voltage when the magnetic flux perpendicularly passing through the SQIF equals the first value; and
   a coil for generating the bias magnetic field through the SQIF from the bias current of the bias circuit, wherein the bias magnetic field provides nullifying feedback to the SQIF that counterbalances a low-frequency portion of the external magnetic field, such that the output voltage of the SQIF detects a high-frequency portion of the external magnetic field.

15. The circuit of claim 14, wherein:
the external magnetic field includes the Earth's magnetic field and an oscillating magnetic field of at least one radio-frequency electromagnetic signal,
the bias magnetic field counterbalances the low-frequency portion of the external magnetic field, including the bias magnetic field counterbalancing the Earth's magnetic field including a changing orientation between the SQIF and the Earth's magnetic field, and
the output voltage of the SQIF detects the high-frequency portion of the oscillating magnetic field of the at least one radio-frequency electromagnetic signal.

16. The circuit of claim 14, wherein the SQIF is a planar array of Superconducting Quantum Interference Devices (SQUID), the SQUIDs in the planar array connected in series for conducting a shared current and spatially arranged with respective sizes distributed to provide the transfer function that at the first value of the magnetic flux perpendicularly passing through the SQUIDs is approximately linear across a range of the magnetic flux centered around the first value, with the output voltage changing considerably from the second value in response to the magnetic flux changing slightly from the first value.

17. The circuit of claim 14, wherein the bias circuit further includes:
   a filter for generating a filtered voltage that separates a low-frequency component of the differential voltage;
   a flux-bias circuit for generating a summation voltage that is a sum of the filtered voltage and a flux-bias voltage, wherein the coil generates the bias magnetic field that, in an absence of perturbation from the external magnetic field, supplies the first value of the magnetic flux of the operating point when the bias current though the coil equals the flux-bias voltage multiplied by a proportionality factor; and
   a drive circuit for generating the bias current that multiplies the summation voltage by the proportionality factor.

18. The circuit of claim 17, wherein:
the filter is an integrator having a cut-off frequency, and the integrator passes the low-frequency component including a plurality of frequencies below the cut-off frequency, the low-frequency component detecting the low-frequency portion of the external magnetic field, and
the bias circuit provides the nullifying feedback of the low-frequency component via the coil, the nullifying feedback making the output voltage of the SQIF provide a high-frequency component including a plurality of frequencies above the cut-off frequency, the high-frequency component detecting the high-frequency portion of the external magnetic field.

19. The circuit of claim 14, wherein the coil generates the bias magnetic field that is substantially uniform across the SQIF, the coil having a selected one of a Maxwell configuration and a Helmholtz configuration.

20. A method detecting at least one electromagnetic signal comprising:
   generating an output that is a transfer function of a magnetic flux through a Superconducting Quantum Interference Array (SQIF), wherein the magnetic flux is supplied from a combination of an oscillating magnetic field of the at least one electromagnetic signal, the Earth's magnetic field, and a bias magnetic field;
   generating a bias current from the output of the SQIF via an integrator, the bias current biasing the SQIF at an operating point having a first value of the magnetic flux through the SQIF and a second value of the output of the SQIF, wherein the transfer function provides the second value of the output of the SQIF when the magnetic flux through the SQIF equals the first value;
   generating the bias magnetic field from the bias current via a coil, wherein the bias magnetic field provides nullifying feedback to the SQIF that counterbalances the Earth's magnetic field; and
   detecting the oscillating magnetic field of the at least one electromagnetic signal at a high-frequency output, wherein a signal path from the output of the SQIF to the high-frequency output does not pass through the integrator and does not pass through any other integrator.

* * * * *